United States Patent
Hassoun et al.

(10) Patent No.: US 7,797,647 B2
(45) Date of Patent: Sep. 14, 2010

(54) CIRCUIT HAVING HARDWARE THREADING

(75) Inventors: Soha M. N. Hassoun, Lexington, MA (US); Brian G. Swahn, Peabody, MA (US)

(73) Assignee: Tufts University, Medford, MA (US)

( * ) Notice: Subject to any disclaimer, the term of this patent is extended or adjusted under 35 U.S.C. 154(b) by 890 days.

(21) Appl. No.: 10/551,837

(22) PCT Filed: Apr. 2, 2004

(86) PCT No.: PCT/US2004/010320

§ 371 (c)(1), (2), (4) Date: Oct. 3, 2005

(87) PCT Pub. No.: WO2004/090759

PCT Pub. Date: Oct. 21, 2004

(65) Prior Publication Data

US 2006/0225002 A1   Oct. 5, 2006

Related U.S. Application Data

(60) Provisional application No. 60/460,080, filed on Apr. 3, 2003.

(51) Int. Cl.
*G06F 17/50* (2006.01)
(52) U.S. Cl. ............................... 716/3; 716/18
(58) Field of Classification Search .................. 716/1–6, 716/18
See application file for complete search history.

(56) References Cited

U.S. PATENT DOCUMENTS

| 4,888,692 | A | | 12/1989 | Gupta et al. | |
|---|---|---|---|---|---|
| 5,367,473 | A | | 11/1994 | Chu et al. | |
| 5,404,529 | A | * | 4/1995 | Chernikoff et al. | 719/315 |
| 5,519,867 | A | * | 5/1996 | Moeller et al. | 718/107 |
| 6,684,261 | B1 | * | 1/2004 | Orton et al. | 719/328 |
| 6,745,160 | B1 | * | 6/2004 | Ashar et al. | 703/14 |
| 7,093,204 | B2 | * | 8/2006 | Oktem et al. | 716/1 |
| 7,200,822 | B1 | * | 4/2007 | McElvain | 716/3 |
| 7,383,166 | B2 | * | 6/2008 | Ashar et al. | 703/14 |
| 2004/0199878 | A1 | * | 10/2004 | Oktem et al. | 716/1 |

OTHER PUBLICATIONS

Robertson W. et. al: "RTL synthesis for systolic arrays". Proceedings of the international symposium on circuits and systems (ISCS), Chicago, May 3-6, 1993, New York, IEEE, US, vol. 2, May 3, 1993, pp. 1670-1673, XP010115439 ISBN: 0-7803-1281-3.*
PCT/US2004/010320 International Search Report dated Oct. 4, 2004.
W. Robertson, S. Periyalwar, W. J. Phillips, RTL Synthesis for Systolic Arrays, Proceedings of the International Symposium on Circuits and Systems, May 3-6. 1983, vol. 2, New York. IEEE, US.

(Continued)

*Primary Examiner*—Jack Chiang
*Assistant Examiner*—Binh C Tat
(74) *Attorney, Agent, or Firm*—Daly, Crowley, Mofford & Durkee, LLP

(57) ABSTRACT

Hardware threading optimizes use of hardware resources in a dynamic workload environment. Unutilized hardware resources are dynamically borrowed to increase throughput performance and/or power savings by enabling parallel processing of application pipeline stages.

7 Claims, 13 Drawing Sheets

OTHER PUBLICATIONS

Miodrag Ptokonjak, Wayne Wolf, Cost Optimization in ASIC Implementation of Period Hard-Real Time Systems Using Behavioral Synthesis Techniques, Nov. 5-9, 1995, pp. IEE/ACM International Conference on Computer-Aided Design, IEE Comp. Soc. Press, US.

U. Nagaraj Shenoy, Prith Banerjee, Alok Choudhary, A System-Level Synethsis Algorithm with Guaranteed Solution Quality, Mar. 27, 2000, pp. 417-424, Paris, France.

* cited by examiner

Non-threaded Execution

Hardware Threaded Execution

| | |
|---|---|
| HTscheduler | (S,R,n,w) |
| Input: | S ≡ Unthreaded Schedule |
| | R ≡ Resource Constraints Per Partition |
| | n ≡ Number of Partitions |
| | w ≡ Window Size |
| Vars: | CurrentState ≡ Current State to be Scheduled |
| | NextState ≡ Next State to be Scheduled |
| | ByPassedEdges ≡ Queue of Edges to Bypass |
| | Borrowed ≡ Queue of Borrowed States |
| | StatesAlreadyScheduled ≡ Array of states already scheduled |
| Output: | HTS ≡ Hardware-threaded Schedule |

1. CurrentState = initialState(S);
2. while *Current State* is not null do
3.   if *IsConditional(CurrentState)* then
4.     for each *child* of *CurrentState*
5.       *HTscheduler(Schedule(child),R,n,w)*
6.   else if *StatesAlreadyScheduled(CurrentState)* =0 then
7.     *StatesAlreadyScheduled(CurrentState)* =1
8.     *NextState=CurrentState*
9.     for ( $i=0;\leq w;i++$ ) do
10.       *NextState=successor(NextState)*
11.       if *IsConditional(NextState)* v *IsJoining(NextState)* then
12.         *i=w*
13.       else
14.         if *IsSchedulable(CurrentState,NextState,R,n)* then
15.           *ByPassedEdges.append(outedge(NextState))*
16.           *Borrowed.append(NextState)*
17.           *StateAlreadyScheduled(NextState)* =1
18.           *CombineStates(CurrentState,NextState)*
19.   if *successor(CurrentState)=Borrowed.top* then
20.     *Borrowed.dequeue.top*
21.     while ! *IsEmpty(Borrowed)* ∧
            *Borrowed.top=(target(ByPassedEdges.top))* do
22.     *Borrowed.dequeuetop*
23.     *ByPassedEdges.dequeuetop*
24.     *CreateEdge(CurrentState,target(ByPassedEdges.top),dashed)*
25.     *ByPassedEdges.dequeuetop*
26.   else
27.     *CreateEdge(CurrentState,successor(CurrentState),dashed)*
28.   *CurrentState=successor(CurrentState)*

*FIG. 6*

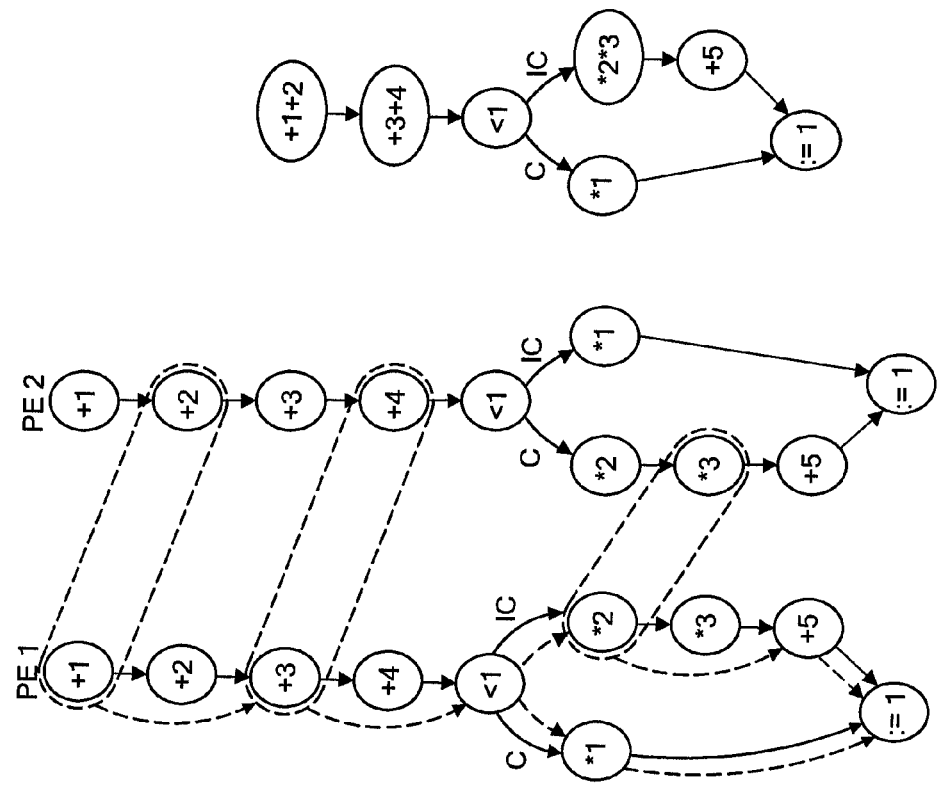
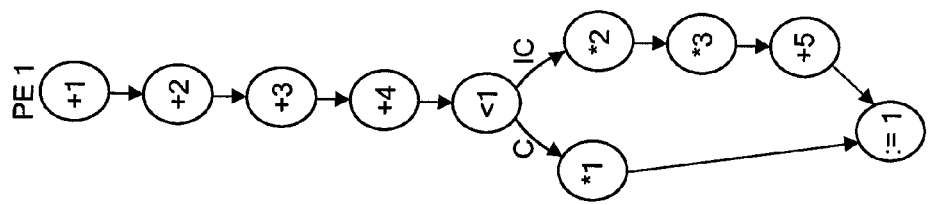
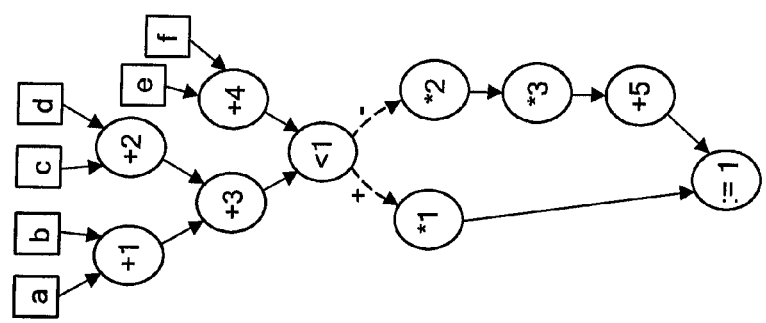
FIG. 7A     FIG. 7B     FIG. 7C     FIG. 7D

US 7,797,647 B2

CIRCUIT HAVING HARDWARE THREADING

CROSS-REFERENCE TO RELATED APPLICATIONS

This application is a National Stage application under 35 U.S.C. §371 of and claims the benefit of International Application No. PCT/US2004/010320 filed on Apr. 2, 2004, which claims priority to Provisional Patent Application 60/460,080, filed on Apr. 3, 2003, which is hereby incorporated by reference.

FIELD OF THE INVETION

The present invention relates generally to data processing and, more particularly, to circuits sharing hardware resources for optimizing data processing performance and/or managing power consumption.

BACKGROUND OF THE INVENTION

As is known in the art, there are a variety of known systems and architectures for processing data. It is expected that next generation communication-enabled systems will appear in homes, offices, cars, military equipment, and the like. While performance, area, and power constraints have to date been the primary focus in designing many current systems, such systems generally have a limited ability to dynamically adapt to changing processing requirements. Disadvantages of such non-configurable systems include a lack of reusability and limited product longevity.

While some level of configurability can be achieved by programming a general purpose embedded processor, or by coupling a Field Programmable Gate Array (FPGA) with a processor, sometimes performance requirements prohibit such combinations. Thus, to meet certain performance requirements, it may be required to design Application Specific Configurable hardware (ASC). A number of application-specific configurable architectures have been proposed having varying granularity (fine vs. coarse), routing resources, configuration abilities, and underlying computational models, e.g., SIMD (Single Instruction-Stream Multiple Data-Stream) vs. MID (Multiple Instruction Multiple Data).

One known architecture utilizes Simultaneous Multi-Threading (SMT) that allows the interleaving of instructions from more than one software thread in a single time slice, thus eliminating processor underutilization when a thread is stalled for cache missed or data and/or control dependencies. SMT spreads software instructions to multiple functional units but does not address hardware under utilization.

It would, therefore, be desirable to overcome the aforesaid and other disadvantages.

SUMMARY OF THE INVENTION

The present invention provides a circuit having dynamic adaptability by using hardware threading. Circuit processing elements are interconnected to enable dynamic borrowing of hardware processing resources of a first processing element by a second processing element. With this arrangement, parallel processing of application pipeline stages is achieved to enhance overall processing performance. In addition, performance and power reduction can be emphasized to meet the needs of a particular application. While the invention is primarily shown and described in conjunction with multimedia and communication applications, it is understood that the invention is applicable to circuits in general in which increased throughput and/or power reduction is desirable.

In one aspect of the invention, a method of designing a hardware threaded circuit architecture includes determining a total area available for processing elements and determining a set of task arrival times for tasks to be processed by the processing elements. The method further includes determining possible implementations for the processing elements within the area available with each of the possible implementations having a corresponding number of processing elements. In addition, the method can include interconnecting at least two of the processing elements to enable hardware threading, determining overall system wait times for the possible implementations, and selecting an implementation based upon the overall system wait times.

In another aspect of the invention, a hardware threaded circuit includes a memory, a task manager coupled to the memory, and a plurality of processing elements coupled to the task manager. First and second processing elements are interconnected in a hardware threaded configuration to enable dynamic borrowing of processing resources associated with the second processing element by the first processing element. With this arrangement, pipeline stages can be processed in parallel by utilizing resources of the first and second processing elements simultaneously.

BRIEF DESCRIPTION OF THE DRAWINGS

The invention will be more fully understood from the following detailed description taken in conjunction with the accompanying drawings, in which:

FIG. 6 is a textual representation of an exemplary algorithm for hardware threading in accordance with the present invention;

FIG. 7A is a graphical depiction of a Discrete Cosine Transform (DCT) function that can be processed using hardware threading in accordance with the present invention;

FIG. 7B is a graphical depiction of an exemplary processing schedule for the DCT of FIG. 7A;

FIG. 7C is a graphical depiction of a hardware threaded schedule for the schedule of FIG. 7B;

FIG. 7D is a condensed graphical depiction of the hardware threaded schedule of FIG. 7C;

DETAILED DESCRIPTION OF THE INVENTION

In general, the present invention provides a novel hardware optimization scheme, referred to as hardware threading (HT), that is useful in building Application-Specific Configurable (ASC) hardware. The inventive hardware threading mechanism dynamically borrows unutilized or underutilized resources to boost processing performance and/or lower power consumption. With this arrangement, in exemplary application domains, such as multimedia and communications, an incoming packet (task) is processed independently of other packets so as to enhance the overall circuit performance.

While the inventive hardware threading technique described herein is primarily shown described in conjunction with multimedia and communication application domains, it is understood that the invention is applicable to circuit architectures in general in which it is desirable to optimize utilization of hardware resources. It will be appreciated that the hardware threading mechanism of the present invention is well suited for applications that require on-demand high-performance processing capabilities.

In an exemplary embodiment, each incoming packet can be processed independently of other packets. Parallel hardware processing therefore improves performance. In addition, the workloads are dynamic and can differ significantly depending on the external environment. These characteristics allow the use of stochastic processes and queuing theory, for example, to analyze system performance and to guide the synthesis of optimal hardware-threaded architectures.

As discussed above, certain applications, such as multimedia and network processing application domains, may benefit from an ability to process tasks independently. As used herein, task refers to an independent packet or thread that arrives and should be processed.

Figure 1:
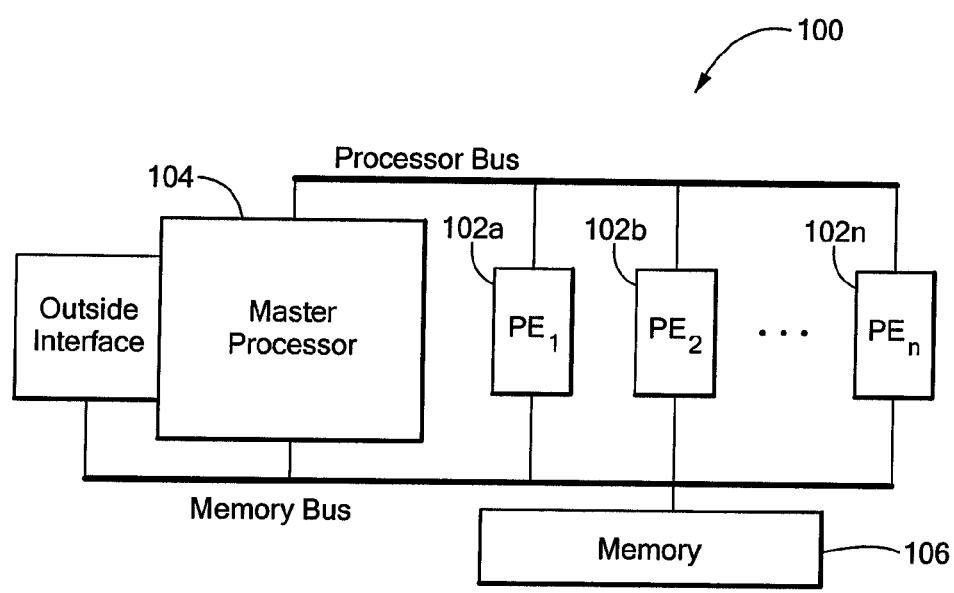
FIG. 1 is a schematic block diagram of a system having hardware threading in accordance with the present invention.

FIG. 1 shows an exemplary system 100 having a series of independent processing elements (PEs) 102a-n providing hardware threading in accordance with the present invention. The system 100 includes a master processor 104 that generates a dynamic schedule to dispatch incoming threads to the processing elements 102. A memory 106 can be coupled to the processor 104 and the processing elements 102 via a memory bus. It is understood that the processing elements 102 and the dynamic scheduling may be part of a larger system.

As described more fully below, the hardware threading mechanism provides temporary borrowing of unutilized pipeline stages from other processing elements to boost throughput performance and/or to reduce the power consumption of tasks running on active processing elements. Borrowing resources involves adding interconnecting and steering data among shared processing elements. With borrowed resources, a task can complete significantly faster by shortening the time consumed by each task.

Figure 2A:
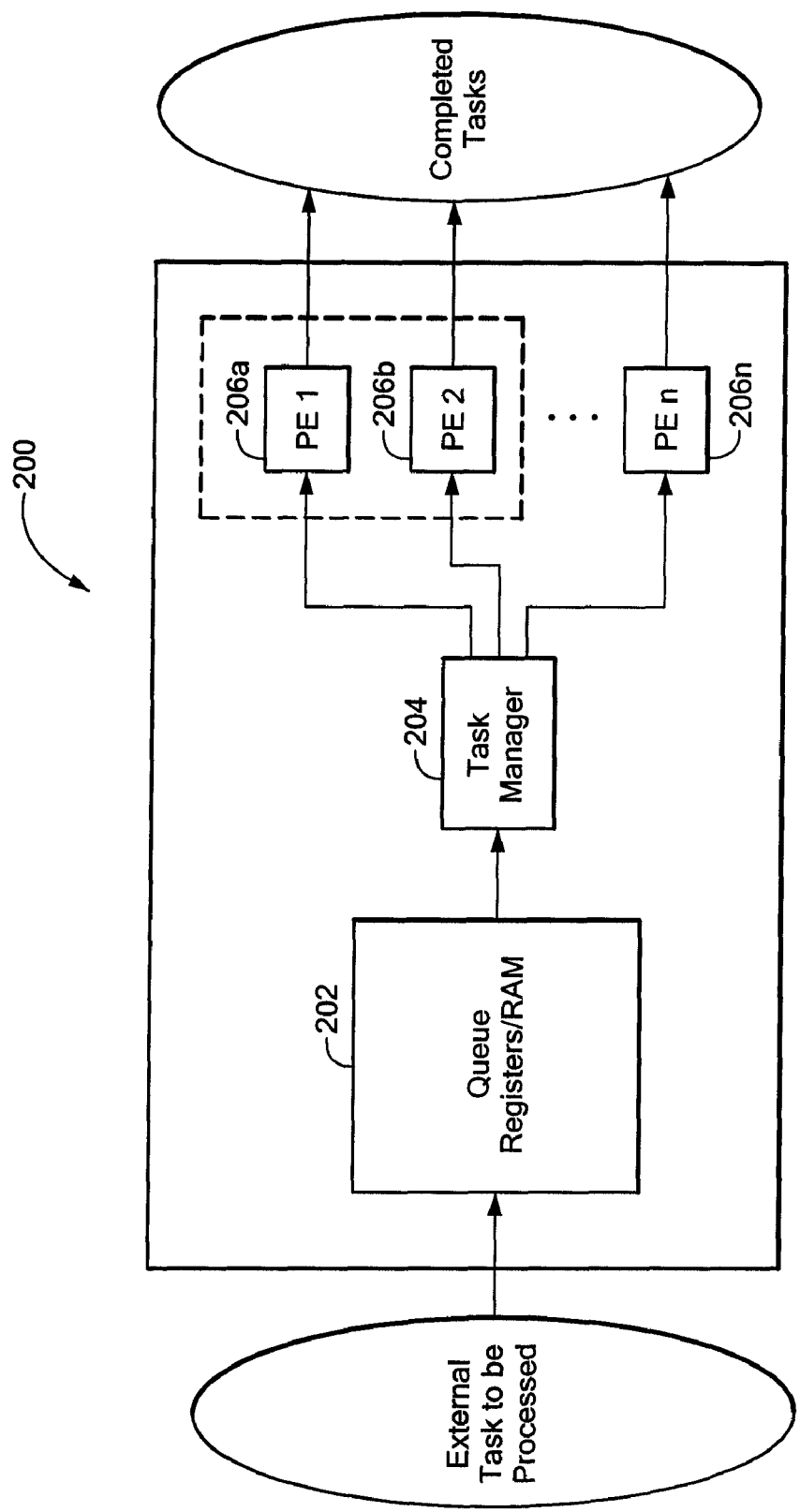
FIG. 2A is a schematic depiction of a system having hardware threading in accordance with the present invention.

FIG. 2A shows an exemplary high level implementation of a hardware threading system 200 in accordance with the present invention. The system 200 includes a queue 202 for receiving external tasks, e.g., packets, to be processed. In one embodiment, the queue 202 can include various registers and memory space in a manner well known to one of ordinary skill in the art. The tasks from the queue 202 are provided to a task manager 204, which can provide the illustrative HT scheduling algorithm shown and described below.

The task manager 204 processes the queued tasks and sends them to a respective one of a series of processing elements 206a-n. It is understood that the system can include any number of processing elements 206. The processing elements can be provided as circuitry capable of providing various computational functions, such as addition, subtraction, multiplication, division, and other logical and mathematical operations typical in functional units or specialized for specific applications.

Figure 2B:
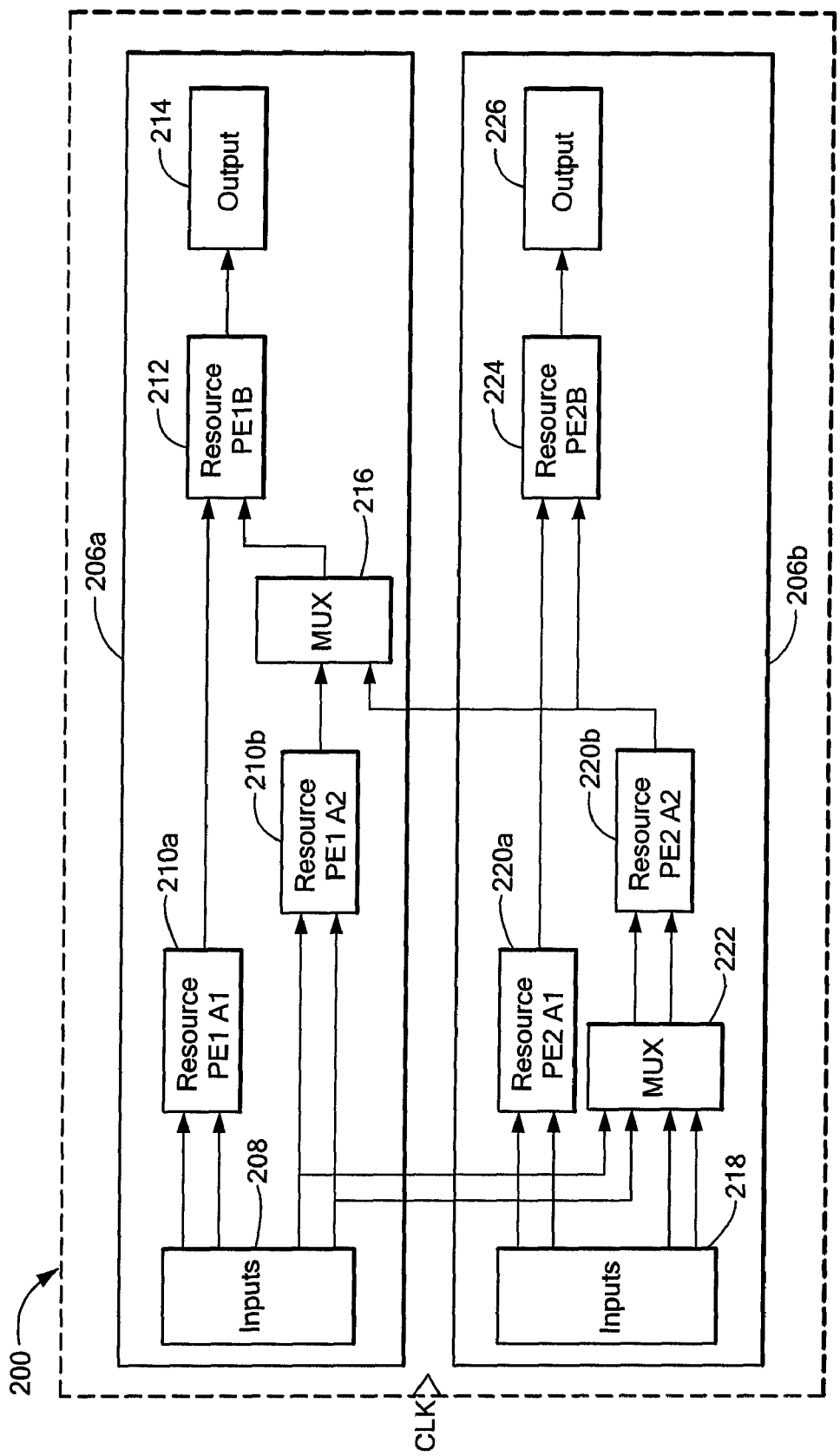
FIG. 2B is a schematic depiction showing further details of the system of FIG. 2A.

FIG. 2B shows further details of an exemplary embodiment of the system 200 of FIG. 2A for which like reference numbers indicate like elements. The first processing element 206a includes an input module 208 coupled to first and second type A resources 210a,b. The first type A resource 210a provides clocked outputs to a type B resource 212, which is coupled to an output module 214. The second type A resource 210b outputs a signal to a first multiplexer 216, which outputs a signal to the type B resource 212.

The second processing element 206b includes an input module 218 providing tasks to a first type A resource 220a and a multiplexer 222. The signals provided to the second type A resource 210b of the first processing element 206a are also provided to the multiplexer 222. A second type A resource 220b receives signals from the multiplexer 222 and provides an output received by a type B resource 224 and to the first processing element multiplexer 216. The type B resource 224 provides signals to an output module 226 of the second processing element.

In one particular embodiment, the type A resources 210a,b, 220a,b correspond to addition resources and the type B resources 212, 224 correspond to multiplication resources. It is understood, however, that the processing elements can include a wide variety of resource types and numbers of resources with departing from the present invention.

A function "func" can be defined as:

```
int func(a,b,c,d)
{
    var1 = a + b;
    var2 = c + d;
    var3 = var1*var2;
    return(var3);
}
```

Figure 2C:
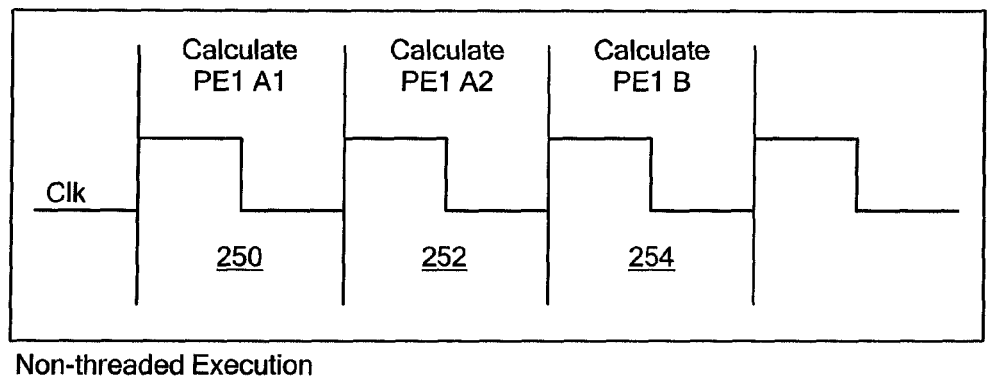
FIG. 2C is a timing diagram showing non-threaded operation of the system of FIG. 2B.
Figure 2D:
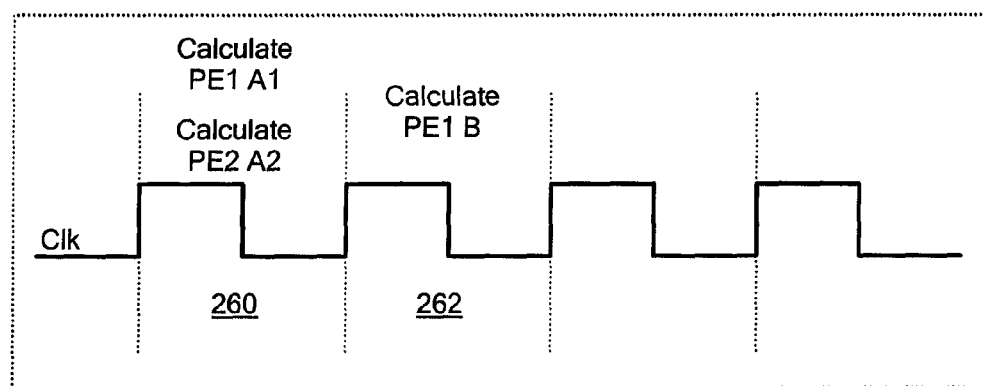
FIG. 2D is a timing diagram showing threaded operation of the system of FIG. 2B.

FIGS. 2C and 2D show timing diagrams for the system of FIG. 2B implementing func(a,b,c,d) above. FIG. 2C shows a timing diagram for non-threaded execution and FIG. 2D shows a timing diagram for threaded execution in accordance with the present invention. It is understood that the clock signal is provided to each type A and type B resource 210a,b, 212, 220a,b, 224, as well as the multiplexers 216, 222.

Referring now to FIG. 2C, in the first cycle 250 the first type A resource 210a of the first processing element calculates a first (addition) result. In the second cycle 252, the second type A resource 210b of the first processing element 206a generates a second result. And in a third cycle, the first processing element type B resource 212 generates a (multiplication) result. It is understood that the second type A resource 210b is not available for processing in parallel with the first type A resource at the time of interest for this example.

Referring now to FIG. 2D, in a first cycle 260 the first processing element 206a first type A resource 210a and the second processing element 206b second type A resource 220b generate (addition) results in parallel. Parallel processing is possible since the signals to the first processing element 206a second type A resource 210b are also provided to the second processing element second type A resource 220b via the multiplexer 222. Results from the second type A resource 220b are provided to the first processing element type B (multiplication) resource 212 via the first processing element 206a multiplexer 216. As can be seen, the threaded execution of FIG. 2D saves one processing cycle over the non-threaded processing of FIG. 2C in this relatively simple example.

Alternatively, the frequency and VDD (supply voltage) may be reduced to save power, as described more fully below. The effects of increased delays (impacting the operating frequency) and interconnect capacitances (affecting power consumption) due to resource borrowing can be weighed against the resulting increased adaptability and performance.

Illustrative target applications perform on-demand execution in an environment that provides a dynamic workload, which can be characterized by a mean arrival rate λ of tasks and by the pattern in which tasks arrive. In one embodiment, it can be assumed that the random inter-arrival times are a sequence of independent, identically distributed random variables that can be modeled as an exponential distribution. Such a distribution has the well-known Markov or memoryless property, which states that if time t has elapsed with no arrivals, then the distribution of further waiting time is the same as it would be if no waiting time had passed. That is, the system does not remember that t time units have produced no arrivals. This is the case for network processors where the arrival of packets is independent. It can be assumed that the workload will continue to have a mean arrival time λ for a long enough time (e.g., order of milliseconds) for the system to achieve a steady state.

A service time within each processing element can also be modeled as an exponential distribution, for example. This implies that the service time remaining to complete a customer service is independent of the service already provided. The processing element service time will be referred to as $W_s$, and the average service rate is $1/W_s$.

Since the exemplary architectural model includes c independent processing elements (PEs), one can adopt a system model based on the M/M/c queuing system, which is well known to one of ordinary skill in the art. M/M/c queuing systems assume random exponential inter-arrival and services times with c identical servers. Note that the M/M/c queuing model can also be developed for other distributions for both the workload and the service time. For example, one might choose to model bursty workloads, or use a hyperexponential distribution for the service time if a large variance exists relative to the mean. It will be readily appreciated by one of ordinary skill in the art that a variety of queuing systems and models can be used without departing from the invention.

In one particular embodiment, the queuing parameters are as follows:

Number of identical servers or processing elements (PEs), c

Average arrival rate of tasks from the environment, λ

Average steady state time a task spends in the PE, $W_s$

Average steady state time a task spends in the queue, $W_q$

Expected steady state number of tasks queued and waiting to be serviced, $L_q$

Expected steady state number of tasks being serviced, $L_s$

One relevant metric in designing and evaluating ASC architectures includes the server utilization ρ, which indicates how efficiently the hardware is being used. The server utilization ρ can be calculated as set forth below in Equation 1:

$$\rho = \frac{\lambda \times W_s}{c} \qquad \text{Eq. (1)}$$

Another relevant metric is the average wait time in the system W, which is inversely proportional to the system throughput. The average system wait time W is given by Equation 2 below $$W = W_s + W_q \qquad \text{Eq. (2)}$$

It is understood that the average steady state time $W_s$ a task spends in the processing element is dependent on the processing element implementation. Recall that it is an average steady state response which takes into account the data dependencies within each task. The average steady state time $W_q$ a task spends in the queue is somewhat more complicated to calculate since it is dependent on the expected steady state number $L_q$ of tasks queued and waiting to be serviced and the expected steady state number $L_s$ of tasks being serviced. The expected steady state number $L_s$ of tasks being serviced can be determined as set forth below in Equation 3:

$$L_s = \lambda \times W_s \qquad \text{Eq. (3)}$$

If the expected steady state number $L_s$ of tasks being serviced is less than c, the expected steady state wait time in the queue will be zero; however, that is not the general case. The average steady state time $W_q$ can be calculated in accordance with Equation 4:

$$W_q = \frac{L_q}{\lambda} \qquad \text{Eq. (4)}$$

The average length of the queue, or the steady state number of tasks in the queue $L_q$ is determined by Equation 5:

$$L_q = \frac{\rho \times C[c, L_s]}{1 - \rho} \qquad \text{Eq. (5)}$$

C[c,Ls], which is known as Erlang's C formula, specifies the probability that an arriving task must queue for processing element service. Erlang's C formula can be expressed as set forth below in Equation 6:

$$C[c, L_s] = \frac{\frac{L_s^c}{c!}}{(1-\rho) \times \sum_{n=0}^{c-1} \frac{L_s^n}{n!} + \frac{L_s^c}{c!}} \qquad \text{Eq. (6)}$$

The utilization ρ, is restricted to be less than 1, since otherwise, the average length of the queue $L_q$ and thus $W_q$ will be either infinite or negative. The system simply becomes overloaded.

In one aspect of the invention, an optimal ASC architecture is designed under different workload arrival rates λ. Given a fixed area, and several possible processing element implementations that vary in their implementation area and thus, their performance ($W_s$) it is desirable to determine the optimal number of processing elements that will provide the best performance under different workload conditions.

Given a set of arrival times $\Lambda = \{\lambda_1, \lambda_2, \ldots \lambda_k\}$, a fixed area A, and several possible implementations for a processing element, it is desired to find the number of processing elements c that maximize throughput across all given $\lambda \in \Lambda$.

In one particular embodiment, the optimal number of processing elements c can be found as follows: Because the total area is fixed and the area for each possible processing element implementation is known, one can determine each c that is possible. For each arrival time $\lambda_i \in \Lambda$, the system wait time W can be calculated using the equations presented above. The task is then to choose the number c of processing elements that minimizes the overall system wait time W.

EXAMPLE

There is a total area of 100 square units, three different processing element designs ($PE_a$, $PE_b$, $PE_c$), each having different area and service time tradeoffs as shown below in Table 1.

TABLE 1

Processing Element Design Tradeoffs

|  | $PE_a$ | $PE_b$ | $PE_c$ |
|---|---|---|---|
| Service time in PE, $W_s$ | 10 | 8 | 6 |
| PE area, $A_i$ | 10 | 15 | 25 |
| # of PEs, c | 10 | 6 | 4 |

Table 1 shows three different processing element designs that trade performance for area. Given a fixed area of 100 units square, the number of possible processing elements is calculated for each design. First, $$c = \left\lfloor \frac{A}{A_i} \right\rfloor$$

is determined, where $A_i$ is the implementation area for PE design i. The results are shown on the last row of Table 1.

Figure 3:
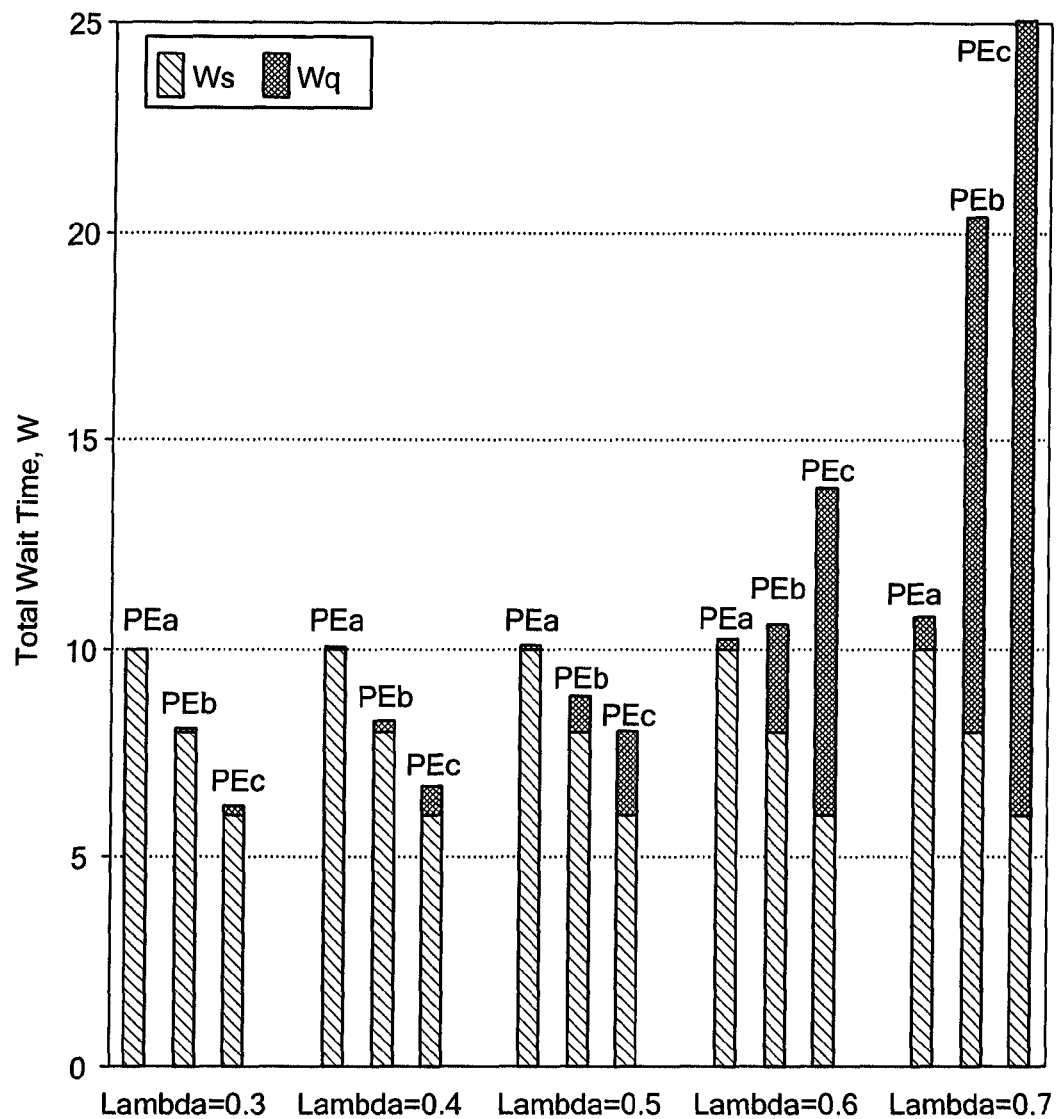
FIG. 3 is a graphical depiction of average total wait times in three systems having hardware threading in accordance with the present invention.

FIG. 3 shows the service wait time in the queue and in the processing elements for the different arrival rates for all three designs after computing the average system wait time W for arrival rates $\Lambda = \{0.3; 0.4; 0.5; 0.6; 0.7\}$. Because there are ten $PE_a$s, and each $PE_a$ has less resources than in $PE_b$ and $PE_c$, the overall system wait time $W_s$ for $PE_a$ is the longest. However, the average steady state time $W_q$ a task spends in the queue is the smallest and remains small across the examined arrival times λs. In contrast, the average steady state time $W_q$ a task spends in the queue is more prominent for designs $PE_b$ and $PE_c$ once the arrival rate exceeds λ=0.6. The queuing time for $PE_c$ at λ=0.7 is infinite because the utilization exceeds 1. If it is known a priori that the arrival rates do not exceed certain values and if the likelihood of each arrival rate is known then one can choose an optimal number of processing elements.

As described above, hardware threading refers to the ability to borrow unused resources from idle processing elements and thread them together to obtain a more optimized architecture. Processing elements can operate either independently without threading, or with "n-threading" when resources from n processing elements are collected to create a threaded processing element. A dynamic scheduler, which can reside in hardware or in software within the master processor (see FIG. 1), sets the configuration mode based on a scheduling policy and on the task arrival rates and the queuing activities. In general, the scheduler policy should complement the way the hardware is designed to achieve a dynamically adaptable hardware configuration. As described below, synthesized threaded hardware can trade off performance and power.

Figure 4:
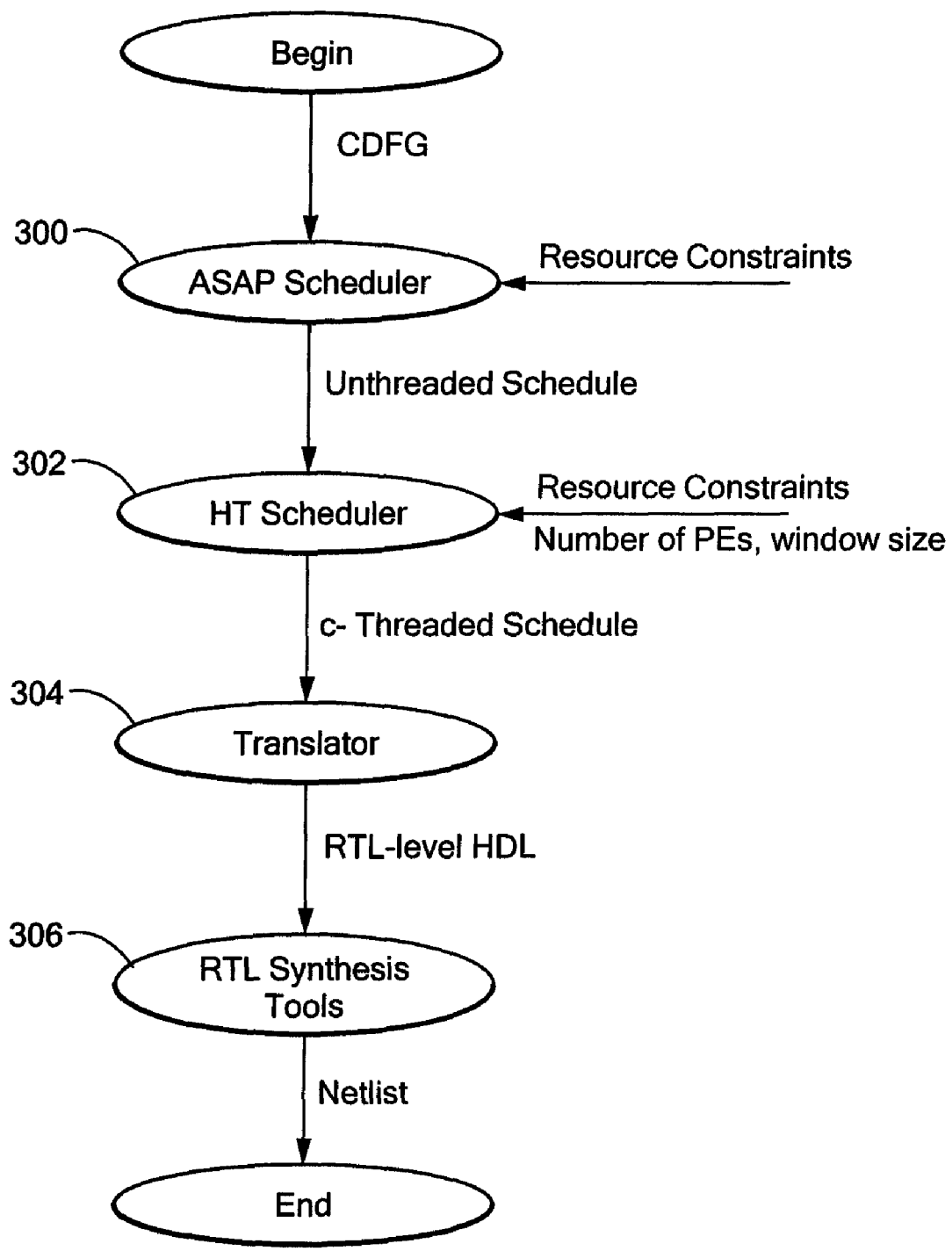
FIG. 4 is a high level flow diagram showing exemplary process steps to produce hardware-threaded architectures in accordance with the present invention.

FIG. 4 shows an exemplary high-level flow diagram showing the process steps of HT synthesis in accordance with the present invention. Initially, the processing element functionality is specified using a Control Flow Data Graph (CDFG) and in step 300 a state-based schedule, where each state corresponds to a pipeline stage, can be generated using any generic scheduling technique, for example ASAP scheduling, which can utilize a technique similar to the known Path-Based Scheduling (PBS) technique. Area or resource constraints guide the scheduling. In step 302, the ASAP schedule is processed by a HT Scheduler module, which is described in detail below. In general, the HT Scheduler module produces an HT schedule to be implemented by an n-threaded PE. The resource constraints here are those assigned to n PEs. HT Scheduler traverses the states in the ASAP schedule trying to look ahead by one ore more states to schedule future operations earlier by maximizing the usage of all available resources. The number of future states examined is referred to as the window size.

In step 304, the HT schedule is translated to Register Transfer Level (RTL) for HDL (Hardware Description Language), which can then by synthesized using a tool, such as Design Compiler from Synopsys Inc., in step 306. Before describing the details of the algorithm, an example is provided below.

EXAMPLE

The following code implements a function f.

```
int f(a,b,c,d,e,f)
{
        var1 = a + b;               // +1
        var2 = c + d;               // +2
        var3 = var1 + var2;         // +3
        var4 = e + f;               // +4
        if(var3 < var4)             // <1
            var5 = var3 * var4;     // *1
        else {
            var6 = var1 * var2;     // *2
            var7 = var6 * var7;     // +5
            var5 = var6 + var7;     // +5
        }
        return (var5);              //         :=1
}
```

Figure 5D:
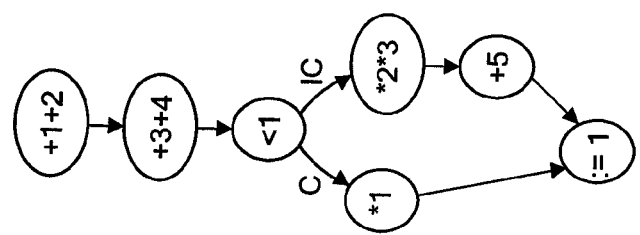
FIG. 5D is a condensed graphical depiction of the threaded schedule from FIG. 5C.
Figure 5C:
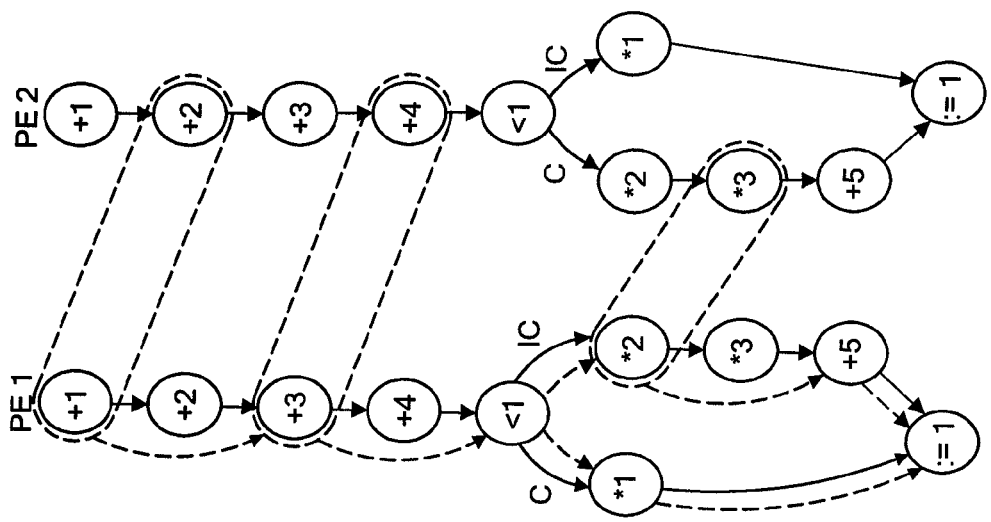
FIG. 5C is a graphical depiction of a hardware-threaded schedule in accordance with the present invention.
Figure 5B:
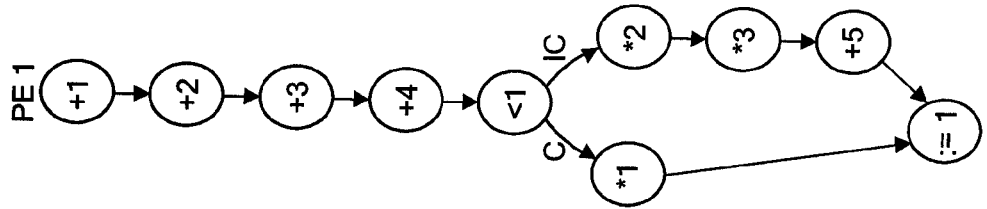
FIG. 5B is a graphical depiction of a processing schedule based on the CDFG diagram of FIG. 5A.
Figure 5A:
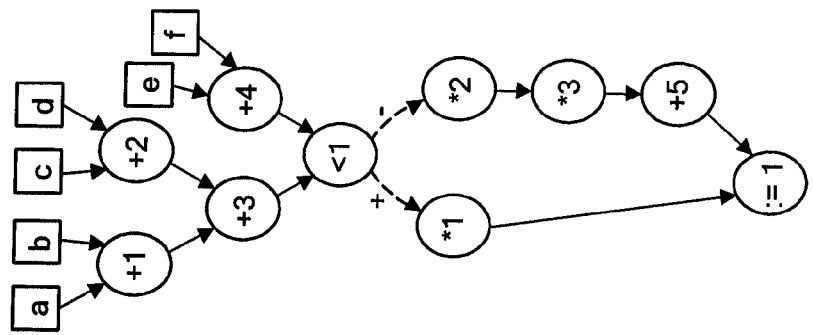
FIG. 5A is a CDFG diagram that can be used to produce hardware-threaded architectures in accordance with the present invention.

FIG. 5A illustrates the corresponding CDFG. Each operation in function f has a label. For example, label +1 refers to the first add operation. The vertices in the CDFG correspond to operations and the edges or arrows represent data and control dependencies.

Resource constraints can include, for example, only one adder and one multiplier being available in one clock cycle.

An add and a multiply operation can be scheduled at the same time, for example, but cannot be chained together. The corresponding ASAP schedule is shown in FIG. 5B. The resulting schedule has nine states or pipeline stages.

In one embodiment, the HTScheduler, which is described in detail below, uses an ASAP schedule to produce a new HT schedule. The threading of two processing elements is conceptually shown in FIG. 5C with two processing elements, two adders and two multipliers available for scheduling in one clock cycle between first and second processing element. Thus, operations +1 and +2 can be scheduled simultaneously, and so can operations +3 and +4. The dashed ellipses indicate operations that will be combined into a single state, or a super state. The solid edges are the original sequencing edges from the ASAP schedule. The dashes indicate changes in the next state from the ones in the original schedule.

For example, the dashed edge from +3 to < indicates that, when hardware threading, state <1 becomes the next state after super state (+3,+4), skipping state +4 in-between. The resulting two-threaded (n-threaded, where n=2) schedule is outlined by the new states and the dashed edges. The threaded version reduces the number of states along the worst case path to six. The reduction in states directly corresponds to a reduction in task execution time, and results in an overall lower service time for the processing elements. FIG. 5D shows a conceptual HT schedule based on the 2-threaded schedule of FIG. 5C.

The inventive synthesis algorithm, an exemplary embodiment of which is shown in FIG. 6 in program code fragment, preserves control and data dependencies in the unthreaded schedule while creating the new threaded implementation. The inputs are an unthreaded ASAP schedule, the relevant processing element resources used when creating the ASAP schedule, the number of partitions or processing elements, and a window size that specifies the number of downstream states that will be examined while traversing the ASAP schedule.

In one particular embodiment, the following variables are used in the embodiment shown in FIG. 6. CurrentState represents a state in the unthreaded schedule. The scheduler's goal is to schedule more operations within this state. NextState is a state in the un-threaded schedule that is being considered for scheduling with CurrentState. If NextState can be scheduled with CurrentState, the two states are scheduled together and the states are said to be threaded together. ByPassedEdges is a queue which holds information about edges in the unthreaded schedule. These edges have their sources already scheduled and their node sinks potentially form an entry point for a new edge. That is, these edges will eventually become bypassed once new edges are inserted. The Borrowed variable is a queue holding all the states that have been combined with the current state. StatesAlreadyScheduled is an array which holds information about all states that have been already scheduled. The resulting threaded schedule is a modified version of the unthreaded schedule where some states become super states with new operations, and new edges connect the super states to the proper next states.

The CurrentState is initially set to the first state in the non-threaded schedule (see line 1). All states in the unthreaded schedule are traversed until the end of the schedule is reached (lines 2, 28). If the CurrentState is a conditional state, the scheduler is recursively called with a subschedule containing all the states along each conditional path (lines 3-5). Once a state is examined (line 6), it is marked as already scheduled (line 7) and the next states within a window of size w are examined (lines 8-18).

The IsSchedulable routine (line 14) checks for resource constraints and for control and data dependencies between the CurrentState and NextState. If the NextState can be scheduled with the CurrentState, then NextState, as well as its edge, are added to the respective queues. The NextState is marked as borrowed and operations of CurrentState and NextState are combined (line 18).

Once all of the states in the window are examined, the edges for the threaded schedule are created (lines 19,27). The new edge maybe created between the CurrentState and the successor state (line 27), or one or more states is skipped due to combining operations within the skipped states with states earlier in the schedule (lines 20-25). In the latter case, the edges and states are skipped one at a time until all Borrowed states are skipped.

While the illustrative algorithm is implemented in the C++ programming language and the HT schedule translation is implemented in synthesizable Verilog, it is understood that other suitable programming languages and synthesis tools will be readily apparent to one of ordinary skill in the art.

As is known in the art, the Discrete Cosine Transform (DCT) is widely used in image compression techniques, such as JPEG (Joint Photographic Experts Group) and MPEG (Moving Picture Experts Group). As described below, the DCT can be used to show the applicability of hardware threading in accordance with the present invention to a multimedia domain. Equation 7 below implements the DCT:

$$X(k) = \alpha(k) \sum_{n=0}^{N-1} x(n)\cos\left(\frac{k\pi(2n+1)}{2N}\right), 0 \le k \le N-1 \qquad \text{Eq. (7)}$$

$$\alpha(k) = \begin{cases} \frac{1}{\sqrt{N}} & k = 0, \\ \sqrt{\frac{2}{N}} & 1 \le k \le N-1 \end{cases}$$

where N is the sequence length, $x(n)$ is the discrete-time signal, and $X(k)$ is the resulting spectral content.

The system first generates a DCT CDFG, which contains two conditional nodes as shown in FIG. 7A. The non-threaded ASAP schedule is then generated as shown in FIG. 7B. The non-threaded schedule is run through the algorithm described above and a corresponding threaded schedule is generated with window sizes (w=1; 2; 3). The optimal schedule was reached with a window size of two as shown below in Table 2. A window size of zero represents a non-threaded schedule.

TABLE 2

Number of states in DCT non-threaded and threaded schedules, and area and timing estimates.

| Window Size | W = 0 | w = 1 | w = 2 |
|---|---|---|---|
| # of Schedule States | 14 | 13 | 12 |
| Area | 6586 | 6940 | 7117 |
| Clock Period | 15.99 | 16.24 | 16.52 |

The resulting optimal threaded schedule is shown in FIG. 7C. FIG. 7D illustrates the effective threaded schedule.

As shown in FIG. 7C, the *1 and *2 operations can be scheduled in the same clock cycle, as well as the +1 and *4 operations. Combining these operations allows the threaded schedule to contain two less states than the non-threaded schedule, as shown in Table 2. The state reduction for the DCT occurs in the innermost loop of the scheduler and thus, allows for the greatest performance gain possible in the hardware threading implementation.

The resulting threaded schedules were then transformed into Verilog HDL, for example, and synthesized using Synopsys Design Compiler, for example, to generate the results shown in Table 2 above. The area overhead was due to additional multiplexers needed to select between the inputs to some of the states. The clock period increase was caused by: (a) the introduction of multiplexors along the critical paths, and (b) the added delay due to the additional interconnect associated with the multiplexers and due to the added fan out load on some of the signals. For this example, a window size of one (w=1) did not increase the clock period from the non-threaded implementation (w=0), because the inserted multiplexer was not on a critical path. In one embodiment, to model these loads the designs were synthesized with a wire load model, which had a load slope of 0.311. The slope was used to estimate the loads associated with the wire lengths. The wire load model was used to derive a minimum clock period for the designs.

The service times for the non-threaded and threaded schedules were simulated and compared. In one embodiment, an abstract cycle-based Verilog model was used for the simulation/comparison. The system included tasks arriving independently of one another with the time spent in the in the queue ($W_q$) and the processing time ($W_s$) recorded.

Figure 8:
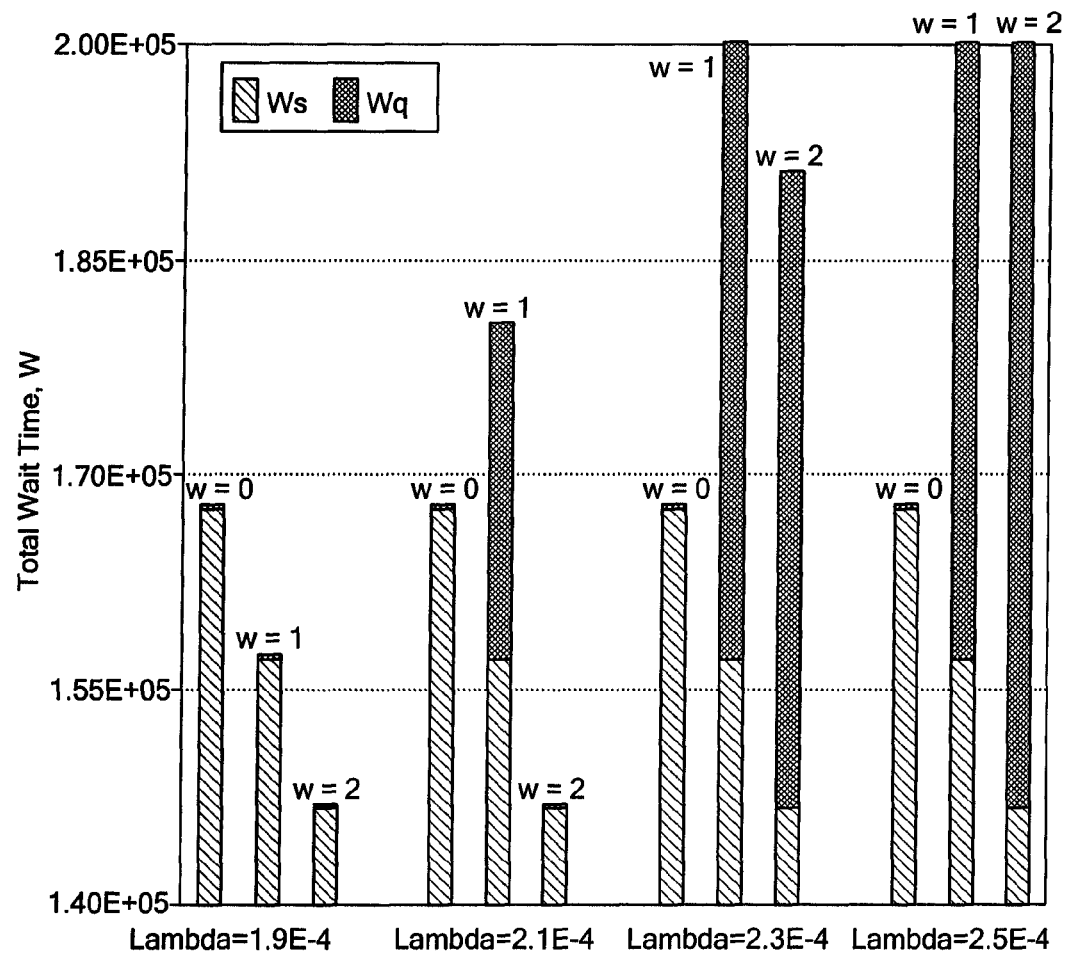
FIG. 8 is a graphical depiction of the total wait time for a Discrete Cosine Transform processed using hardware threading in accordance with the present invention.

As the arrival rate changed, the system wait times varied as shown in FIG. 8. For larger arrival times x the non-threaded (w=0) architecture had the best service time. However, the threaded architectures provided a more efficient solution at smaller arrival times λ. The service time for w=2 for λ=1.9E−3 shows a 13% improvement in performance.

In another aspect of the invention, a threaded mode of operation can be used to lower average system power while maintaining a constant system wait time similar to that of a non-threaded mode of operation. Power can be reduced by decreasing the clock frequency, and/or decreasing the supply voltage and clock frequency given below in Equation 8 below:

$$P_{dyn}=C_L V^2_{DD} f \qquad \text{Eq. (8),}$$

where $V_{DD}$ is the supply voltage, and f is the clock frequency, and $C_L$ is the load capacitance.

The following describes an analysis between the non-threaded and threaded architectures using a window size of zero and two respectively. The power reduction is based on $W_s$ with a constant $W_q$ between the two architectures. By allowing the threaded architecture average steady state time $W_s$ a task spend in the processing element to be equivalent to that of the non-threaded architecture, the frequency of the threaded architecture can be scaled down. For example, the lowest arrival rate λ in FIG. 8 shows a $W_s$=1.67E6 for the non-threaded architecture and $W_s$=1.46E6 for the threaded architecture. By setting the threaded wait time equal to the non-threaded wait time and using the number of threaded clock cycles, the frequency reduction can be calculated. That is, the benefits of threading can be used to decrease the frequency instead of improve throughput. In this example, the frequency can be scaled, such that $f_{new}$=0.87$f_{old}$. In scaling f alone, a 13% reduction in power can be achieved.

The supply voltage can also be scaled down since the frequency is lower than in the original case. This allows the normalized delay to be increased. The normalized delay here is 1/f, which equates to 1.15. If the original supply voltage was 5V, then the supply voltage can be reduced to ~3.75V, given a normalized delay curve. The voltage and frequency scaling for this example shows $P_{new}$=0.49$P_{old}$. The threaded architecture allows a substantial savings in power for the same system wait time as the non-threaded architecture.

As is known in the art, the Discrete Fourier Series (DFS) can represent periodic discrete-time signals, and is often used for calculations involving linear time-invariant systems. DFS was investigated to show the applicability of the inventive hardware threading to a multimedia domain. The coefficients of the DFS were calculated according to Equation 9 below:

$$c_k = \frac{1}{N}\sum_{n=0}^{N-1} x(n)e^{-j\frac{k2\pi n}{N}}, \; 0 \le k \le N-1 \qquad \text{Eq. (9)}$$

where N is the sequence length, x(n) is the discrete-time signal, and $c_k$ is the resulting discrete-time Fourier-series coefficient.

The synthesis and investigation procedure followed those performed for the DCT above. The number of states versus the window size can be seen in Table 3 below. After a widow size of one, the operation level parallelism was exhausted in the non-threaded schedule.

TABLE 3

Number of states in DFS non-threaded and threaded schedules, and area and timing estimates.

| Window Size | W = 0 | W = 1 |
|---|---|---|
| # of Schedule States | 9 | 8 |
| Area | 5412 | 5487 |
| Clock Period | 16.98 | 17.42 |

Table 3 shows area and timing overhead associated with hardware for the DFS example. Similar to the DCT, timing delays were associated with the additional interconnect. With only a state reduction of one, the hardware threading overheads were minimal. The two states combined were inner loop states, and threading states within an inner loop yield the greatest performance increase.

Figure 9:
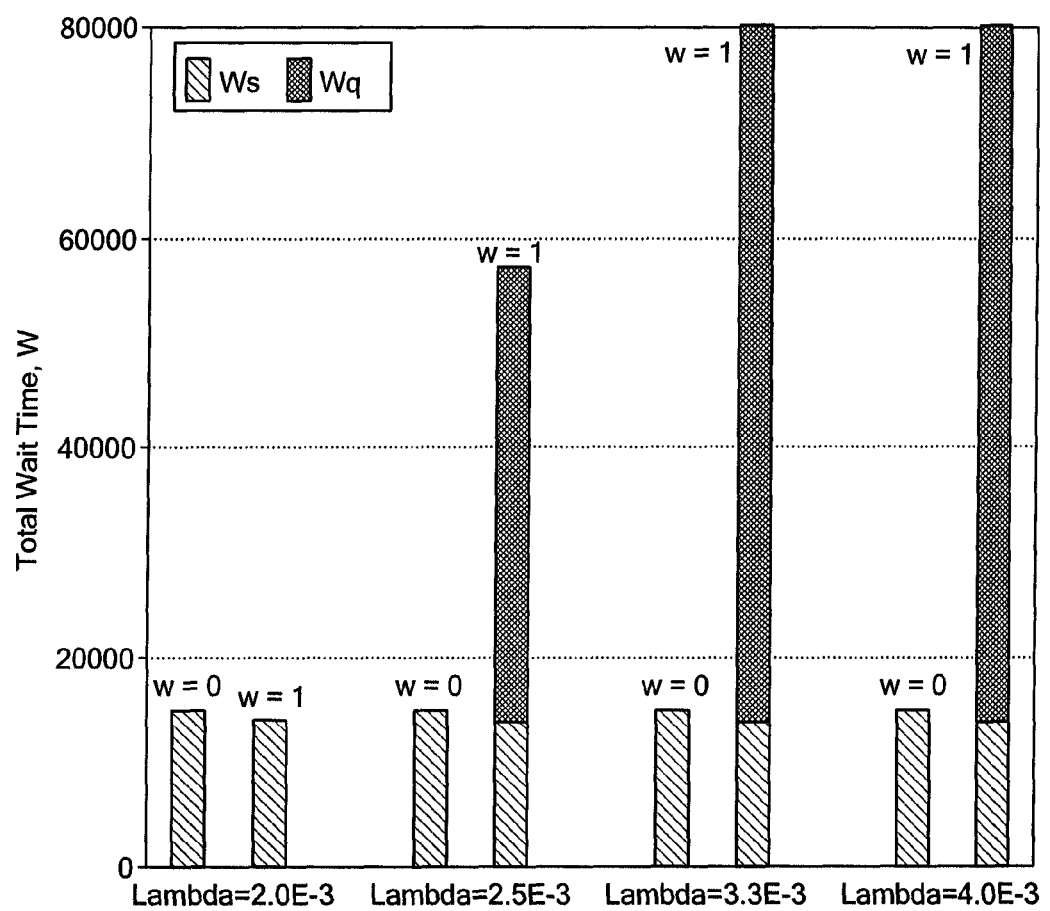
FIG. 9 is a graphical depiction of the total wait time for a Discrete Fourier Series processed using hardware threading in accordance with the present invention.

The resulting threaded and non-threaded architectures were placed in a simulation environment and the system arrival rates were varied. The system responses are as shown in FIG. 9. Like the DCT example, the DFS example also shows that as the arrival rate decreases, the system wait time can be reduced by hardware threading.

Similarly, one can maintain the service times while reducing the frequency and VDD to lower power consumption. Looking again at FIG. 9, the non-threaded architecture has a steady state PE task time of $W_s$=1.54E4 while the threaded architecture has a steady state PE task time of $W_s$=1.4E4. Given these wait times and the periods in Table 3, the two modes can be equated and a frequency scaling of $f_{new}$=0.92$F_{old}$ is obtained. This lower frequency leads to a power reduction of about 8%. With the lower frequency, the supply voltage can also be reduced. If the old supply voltage was 5V, then the new supply voltage can be reduced to about 4.5V, as mentioned in the DCT example. The supply voltage scaling leads to $P_{new}$=0.73$P_{old}$. By utilizing the inventive hardware threading mechanism, about a 27% reduction in power can be achieved with the threaded system wait time equal to that of the non-threaded system wait time.

In another example, the Discrete Fourier Transform (DFT) processing is evaluated with hardware threading. The DFT examined here was defined in Equation 10 below:

$$X(k) = \sum_{n=0}^{N-1} x(n)e^{-j\frac{2\pi nk}{N}}, \quad 0 \le k \le N-1 \quad \text{Eq. (10)}$$

where N is the sequence length, x(n) is the discrete-time signal, and X(k) is the resulting spectral content The synthesis and simulation followed the same guidelines set forth by the previous examples. The number of states versus window size are shown in Table 4 below. Table 4. Number of states in DFT non-threaded and threaded schedules, and area and timing estimates.

| Window Size | W = 0 | W = 1 | W = 2 |
|---|---|---|---|
| # of Schedule States | 10 | 9 | 8 |
| Area | 6890 | 6893 | 6988 |
| Clock Period | 15.54 | 16.50 | 17.96 |

Table 4 shows that an optimal threaded schedule was reached after a window size of two. Like the previous examples, the state reduction occurred in the inner most loop of the schedule, which allowed for the greatest performance increase. Table 4 also shows area and timing results in addition to the number of states. The three different hardware configurations were simulated in an environment model and the resulting system wait times were monitored.

Figure 10:
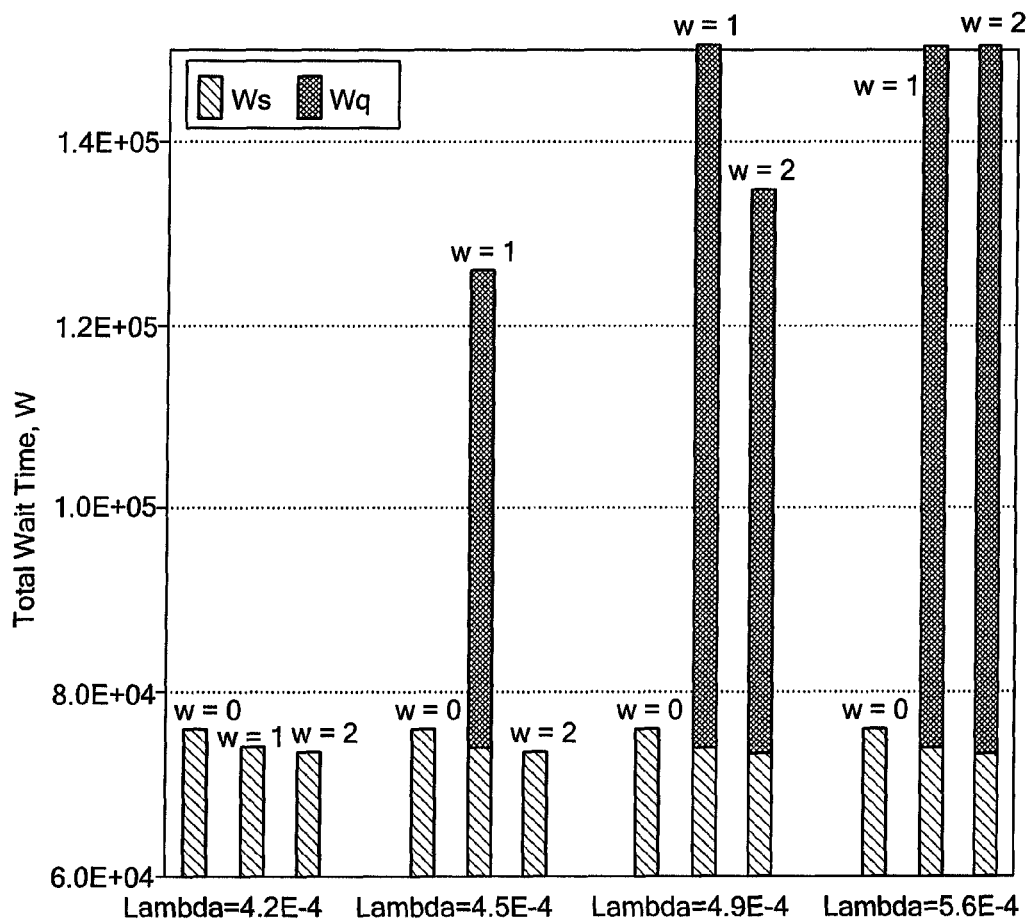
FIG. 10 is a graphical depiction of the total wait time for a Discrete Fourier Transform processed using hardware threading in accordance with the present invention.

FIG. 10 shows the recorded system responses due to changes in the task arrival rate. In looking at this figure, it can be seen that the architecture with a window size of two provided the lowest system wait times and was also the best candidate for a low power mode of operation. At the lowest arrival rate λ, the threaded system wait time is $W_s=7.3E4$, while the non-threaded system wait time was approximately $W_s=7.6E4$. Relating these two system wait times as done in the previous examples yields a frequency scaling of $f_{new}=0.96f_{old}$, and thus a power reduction of 4%. This may not be significant, but if voltage scaling is also used, then a greater degree of power reduction can be achieved. For instance, if the original supply voltage is 5V, the new supply voltage can be scaled back to about 4.8V. This will yield $P_{new}=0.88P_{old}$, and a power savings of 12%. The power savings is not as great as the previous examples, but power was reduced and system wait times of the non-threaded architecture were met.

The Fast Fourier Transform (FFT) is yet another application in signal processing that can benefit from the inventive hardware threading techniques described herein. Like the other examples, the FFT was considered for its applicability to a broad range of applications and its popularity. The FFT used in this example was in the form set forth below in Equation 11:

$$X(k) = \sum_{n=0}^{\frac{N}{2}-1} x(2n)e^{-j\frac{4\pi nk}{N}} + \sum_{n=0}^{\frac{N}{2}-1} x(2n+1)e^{-j\frac{2\pi(2n+1)k}{N}}, \quad \text{Eq. (11)}$$

$$0 \le k \le N-1$$

where N is the sequence length, x(n) is the discrete-time signal, and X(k) is the resulting spectral content. As in the other examples, the FFT was synthesized and simulated in the environmental model. The states versus window size for the FFT are located in Table 5 below.

Table 5. Number of states in FFT non-threaded and threaded schedules, and area and timing estimates.

| Window Size | W = 0 | W = 1 |
|---|---|---|
| # of Schedule States | 13 | 12 |
| Area | 9068 | 10237 |
| Clock Period | 16.50 | 16.99 |

Like the DFS, all non-threaded schedule parallelism was achieved with a window size of one.

Figure 11:
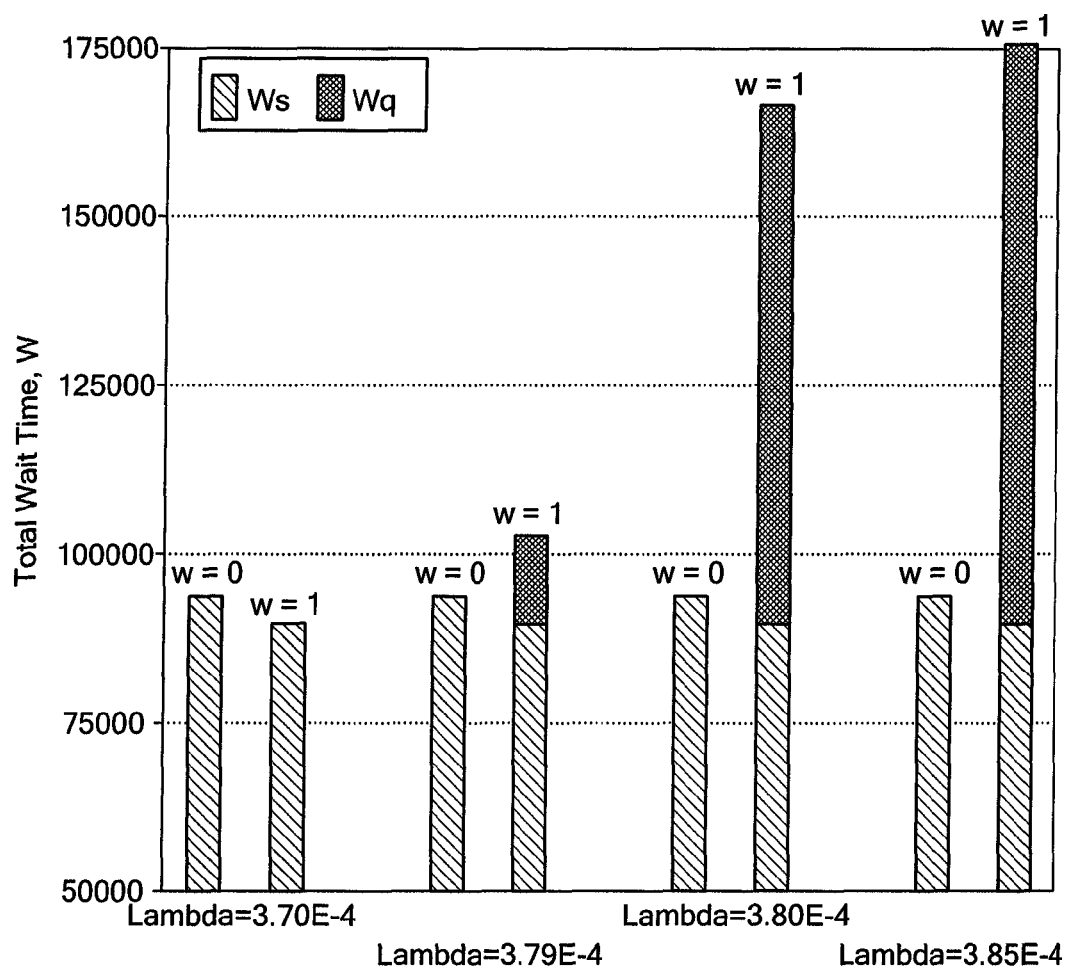
FIG. 11 is a graphical depiction of the total wait time for a Fast Fourier transform processed using hardware threading in accordance with the present invention.

The non-threaded and 2-threaded architectures were simulated and the resulting system wait times are shown in FIG. 11. At lower arrival rates, the threaded architecture had a smaller total wait time than the non-threaded architecture. This lower system wait time can also be used to reduce power as in the previous examples. For example, if the threaded architecture wait time (Ws=9.0E4) was to be that of the non-threaded architecture (Ws=9.4E4), then the frequency of the threaded architecture can be scaled back such that $f_{new}=0.95f_{old}$. This leads to a power savings of about 5%. If the supply voltage is also scaled along with the frequency, then the power savings are more significant. For example, if the original supply voltage was 5V, the new supply voltage can be reduced to about 4.75V. When this occurs, $P_{new}=0.85P_{old}$ and a power savings of about 15% is achieved.

The present invention provides a technique for high-level synthesis that addresses the synthesis of dynamic datapaths based on dynamic workloads. The inventive hardware threading technique requires little overhead while creating an adaptable system that allows a range of power and performance capabilities.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A computer-implemented method of scheduling processing in a hardware threaded circuit, comprising:
   in a processor, receiving inputs corresponding to unthreaded processing of an application;
   receiving and storing in a memory information including processing element resources, a number of processing elements, and a window size corresponding to a number of downstream processing states to be examined;
   generating a hardware threaded schedule for processing the application with at least first and second one of the processing elements being interconnected to enable dynamic resource sharing;
   synthesizing the hardware threaded schedule to an Application Specific Circuit (ASC); and
   synthesizing the hardware schedule to maximize throughput,
   wherein the first and second processing elements each include a first type of resource and a second type of resource and a multiplexer such that the interconnection includes at least one input signal being provided to the first type of resource in the first and second processing elements.

2. The method according to claim 1, further including synthesizing the hardware threaded schedule to reduce power consumption.

3. The method according to claim 1, further including receiving resource constraint information for the processing elements.

4. The method of claim 1, wherein the at least first and second one of the processing elements are multiplexed.

5. A hardware threaded circuit system, comprising:
an input to receive inputs corresponding to unthreaded processing of an application;
a memory to store information including processing element resources, a number of processing elements, and a window size corresponding to a number of downstream processing states to be examined;
a task manager coupled to the memory for synthesizing a hardware threaded schedule to an Application Specific Circuit (ASC) and maximizing throughput; and
a plurality of the processing elements coupled to the task manager, wherein first and second ones of the plurality of processing elements are interconnected for hardware threaded processing to enable dynamic borrowing of processing resources associated with the second one of the plurality of processing elements by the first one of the plurality of processing elements,
wherein the first and processing elements each include a first type of resource and second type of resource and a multiplexer such that the interconnection includes at least one input signal being provided to the first type of resource in the first and second processing elements.

6. The system according to claim 5, wherein the circuit reduces power consumption compared to a non-threaded processing for substantially similar system wait times.

7. The system according to claim 5, wherein the interconnection includes a connection from an output of the second processing element first type of resource to the first processing element.

* * * * *

UNITED STATES PATENT AND TRADEMARK OFFICE
CERTIFICATE OF CORRECTION

PATENT NO. : 7,797,647 B2  
APPLICATION NO. : 10/551837  
DATED : September 14, 2010  
INVENTOR(S) : Hassoun et al.

Page 1 of 1

It is certified that error appears in the above-identified patent and that said Letters Patent is hereby corrected as shown below:

Col. 1 line 43, delete "MID" and replace with --MIMD--.

Col. 4 line 30, delete "206$b$includes" and replace with --206$b$ includes--.

Col. 4 line 33, delete "206$a$are" and replace with --206$a$ are--.

Col. 4 line 45, delete "with" and replace with --without--.

Col. 6 line 19, delete "below" and replace with --below:--.

Col. 8 line 31, delete "ore" and replace with --or--.

Col. 8 line 37, delete "by" and replace with --be--.

Col. 9 line 10, delete "between first" and replace with --between the first--.

Col. 9 line 10, delete "element." and replace with --elements.--.

Col. 9 line 19, delete "in-between." and replace with --in between.--.

Col. 11 line 27, delete "in the in the" and replace with --in the--.

Col. 11 line 30, delete "x" and replace with --$\lambda$--.

Col. 12 line 22, delete "widow" and replace with --window--.

Col. 13 line 8, delete "content" and replace with --content.--.

Signed and Sealed this  
Eleventh Day of January, 2011

David J. Kappos  
*Director of the United States Patent and Trademark Office*